Dec. 3, 1963 S. J. POTOCKI 3,112,723

AUTOMATIC FLUXING MACHINE

Filed May 15, 1961 2 Sheets-Sheet 1

INVENTOR.
Stanley J. Potocki
BY James T Barr
ATTY.

Dec. 3, 1963 S. J. POTOCKI 3,112,723

AUTOMATIC FLUXING MACHINE

Filed May 15, 1961 2 Sheets-Sheet 2

INVENTOR.
Stanley J. Potocki
BY James T. Barr
ATTY.

United States Patent Office 3,112,723
Patented Dec. 3, 1963

3,112,723
AUTOMATIC FLUXING MACHINE
Stanley J. Potocki, Chicago, Ill., assignor to Admiral Corporation, Chicago, Ill., a corporation of Delaware
Filed May 15, 1961, Ser. No. 110,051
3 Claims. (Cl. 113—95)

This invention relates to a soldering machine, and more particularly to an improved machine for fluxing and applying solder to a sheet of insulating material having a plurality of electrical conductors disposed on a surface of the sheet for the purpose of soldering the conductors.

This machine is especially adaptable to the soldering of printed circuits. One common type of printed circuit comprises a sheet of electrically insulating material, such as a phenolic board, carrying on one surface thereof a plurality of electrical conductors in the form of thin flat strips integrally united to the insulating material. The conductors are referred to as printed wiring. The printed circuit assembly is completed by mounting on the other surface of the sheet (or "wiring board") a number of components and connecting them by means of leads extending through apertures in the wiring board to the printed wiring on the other side. There is a considerable problem in making these connections rapidly, efficiently, and effectively.

In the highly competitive field concerned with the manufacture of printed circuits for use in all types of electrical and electronic equipment, it is desirable to have an automatic machine which is capable of soldering all of the connections of a printed circuit substantially simultaneously. This has been done by careful fluxing to clean the conductor surfaces, heating, and bathing the entire printed circuit side of the board in molten solder. The solder then adheres to and alloys with the copper circuitry, but not to the phenolic board. The component leads are soldered to the circuit for permanent electrical connection.

In order to properly clean the surface of the copper wiring, it is desirable that a liquid soldering flux be applied uniformly to the board. This flux material is commonly a resin which will harden upon drying. If this resin is too generously applied, the likelihood of its clogging the volume potentiometer or tuning elements of a typical radio assembly printed circuit board is greatly increased. In addition, much of the expensive fluxing material may be wasted. On the other hand, sufficient flux application must be guaranteed to insure proper bonding of the solder to the copper circuit so that all electrical connections will be sound.

The automatic application of flux prior to soldering in automatic soldering machines has posed a problem not heretofore satisfactorily solved. However, by the present invention the flux application may be simply controlled and accomplished in such manner as to avoid obstructing the movable elements in the circuitry without underfluxing.

In accordance with the preferred embodiment of the present invention, objects to be soldered are carried in sequence past a flux applicator. As each successive object passes the applicator soldering flux is applied thereto uniformly and without substantial waste. The successive objects to be soldered then pass a soldering station which comprises a soldering "pot" of standard design. The flux applicator of the preferred embodiment includes a rotatable, cylindrical screen, which dips into a supply of flux contained within its housing at a predetermined level and carries upwardly a thin film of the flux. Air blower means are provided with an outlet within the cylindrical screen for blowing this film of flux off the screen and against the object to be soldered. Because of possible irregularity in the spacing between the objects to be soldered and because of the fact that it was found to be impractical to employ a cylindrical screen without axially extending supports, control apparatus is provided for controlling blower operation and screen rotation in accordance with the amount of flux desired to be applied and the presence or absence of the objects to be fluxed at predetermined locations.

Accordingly, it is an object of this invention to provide a novel soldering machine which overcomes the above mentioned disadvantages of prior machines and techniques of soldering.

Another object of this invention is to provide an automatic soldering machine which accomplishes clean, well-soldered joints rapidly, effectively, and efficiently and which uses a minimum amount of solder and flux.

A further object of this invention is to provide an automatic soldering machine with flux applicator means and controls therefor that permit careful adjustment of the amount of flux applied while reducing waste.

A still further object of this invention is to provide fluxing apparatus that obviates the necessity of heating the boards before soldering.

Still another object of this invention is to provide an easily adjustable, simply constructed, but effective means of applying flux to a printed circuit board before soldering in a completely automatic soldering process.

Further objects and advantages of this invention will be apparent from consideration of the following description and the accompanying drawings illustrative of the preferred embodiment.

Figure 1:
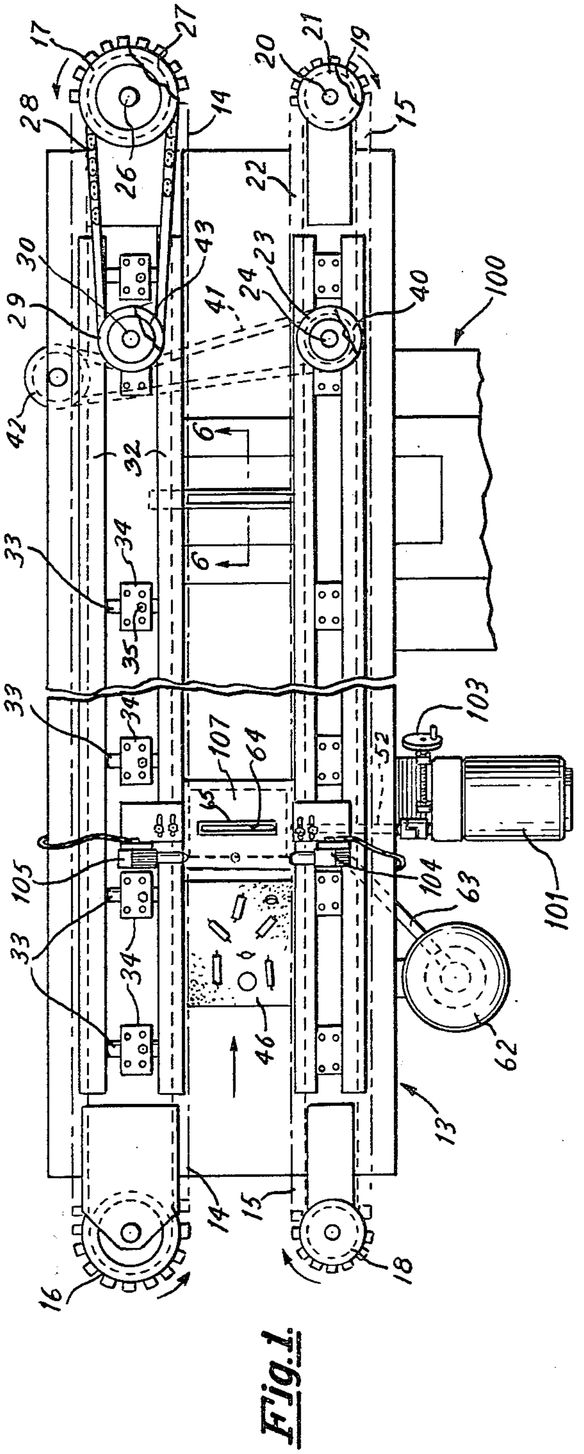
FIGURE 1 is a plan view of the soldering machine constructed in accordance with the present invention.

Referring now in greater detail to the accompanying drawings, in which like reference numerals designate like parts, the machine includes a flux applicator station 10 and soldering stations. The conveyor apparatus 13 for carrying objects to be soldered past the fluxing and soldering stations. The conveyor apparatus 13 is specifically designed to handle flat printed boards with components mounted thereon and the printed wiring circuitry exposed on the bottom side thereof. The conveyor apparatus consists of a pair of endless link chains 14 and 15 which travel along tracks in a well known manner. The chain 14 operates over sprockets 16 and 17, while the chain 15 operates over sprockets 18 and 19. The sprockets 16 and 18 are idler sprockets, while the chains 14 and 15 are driven by sprockets 17 and 19. As seen best in FIGURE 2, the sprocket 19 is secured to a short shaft 20 to which there is also secured a sprocket 21. The sprocket 21 is connected by a chain 22 to a sprocket 23 which is secured to a power driven shaft 24.

A similar construction is provided for the conveyor chain 14, the sprocket 17 being secured to a shaft 26 to which there is also secured sprocket 27. The sprocket 27 is connected through a chain 28 to a sprocket 29 secured to a power driven shaft 30.

Figures 3, 4, 5:
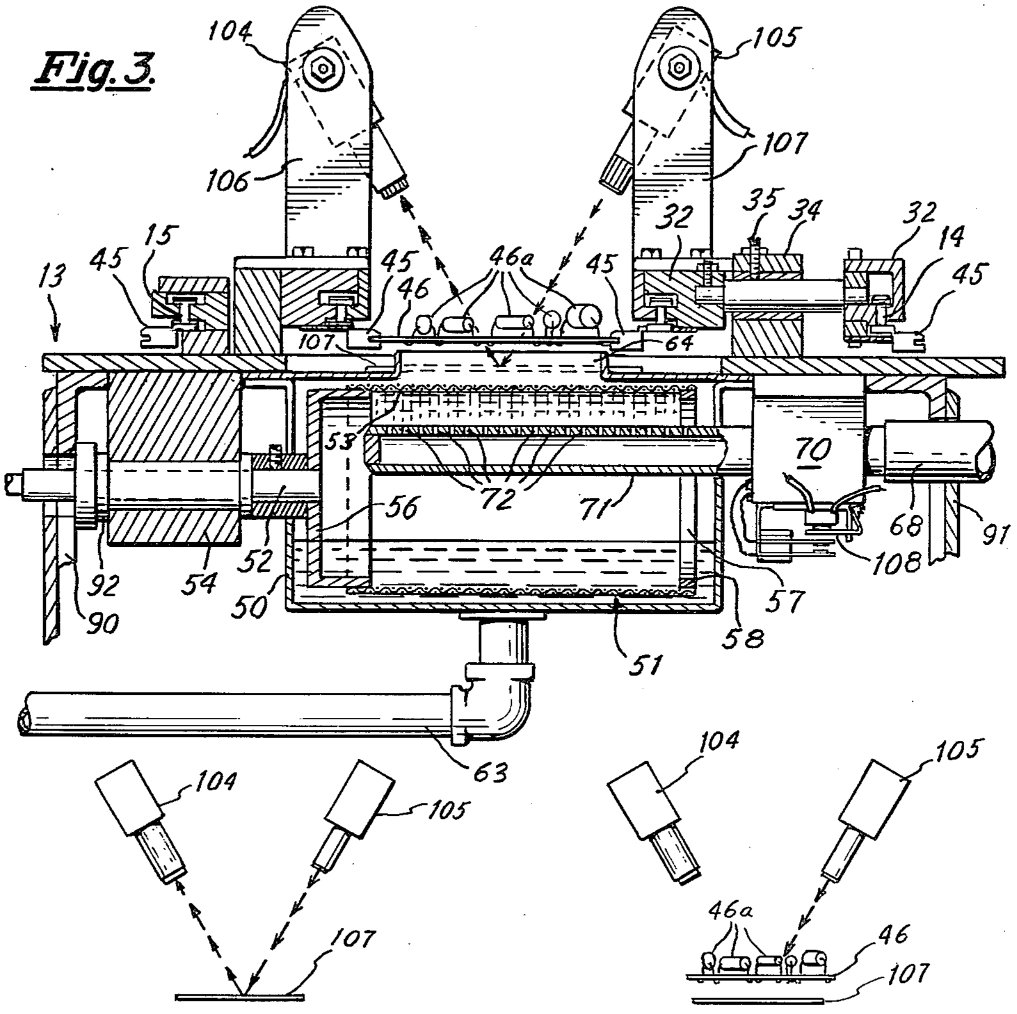
FIGURE 3 is a partial cross-sectional view taken along line 3—3 of FIGURE 1.
FIGURE 4 is a diagrammatic representation of the photocell arrangement employed in the control of the fluxing operation.
FIGURE 5 shows the photocell arrangement with the beam interrupted by the presence of a board to be soldered.
Figure 6:
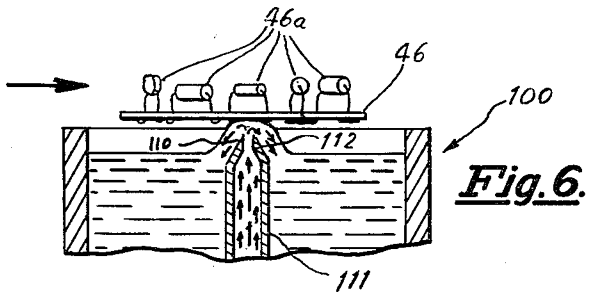
FIGURE 6 shows schematically in cross section the soldering pot with a board in position to receive solder after passing the fluxing station.

The two sprockets 16 and 17 supporting the conveyor chain 14 are larger in diameter than the sprockets 18 and 19 in order to permit the conveyor chain 14 to span certain adjustment apparatus associated therewith. More particularly, the conveyor chain 14 along with the associated sprockets and shafts are supported on a movable frame work 32 which includes a series of shafts 33, each of which extends through a pillow-block 34, all as best seen in FIGS. 1 and 3. Since the shafts 33 are slidable within the pillow blocks 34 it will be seen that the framework 32, along with the conveyor chain 14 and its associated sprockets, can be moved toward and away from the cooperating conveyor chain 15. The shafts 33, and hence the entire framework 32, may be locked in adjusted position by set screws 35 arranged in each pillow block 34.

In the illustrated embodiment of the invention this method of adjustment is limited by practical factors to a total adjustment of approximately one inch. Where greater adjustment is desired the pillow blocks 34 may be adjustable in their positions on the machine frame or base. A number of spaced apart mounting holes are provided for each pillow block 34. Since adjustability of the spacing between the conveyor chains 14 and 15 does not of itself constitute a feature of the present invention, it is not described in further detail herein.

Returning to the two previously mentioned drive shafts 24 and 30 it will be appreciated that they must be driven at constant relative speeds. As shown in FIG. 1, this is accomplished through a fixed ratio drive connection which permits the shaft 30 to move with respect to the shaft 24 along with the entire framework 32. A sprocket 40 is secured to the shaft 24, as seen best in FIG. 2, and a chain 41 extends over sprocket 40 and over an idler sprocket 42. Another sprocket 43, shown in part in FIG. 1, is identical to the sprocket 29 and is secured to shaft 30 directly below the sprocket 29. Sprocket 43 bears against the chain 41 and is driven thereby. It will be appreciated that shifting of the framework 32 in the manner described above will merely cause the second sprocket on the shaft 30 to roll along the chain 41 without interrupting effective driving engagement therewith. It will also be seen that a positive relationship between the speeds of the two drive shafts 24 and 30 is maintained. In the illustrated embodiment of the invention the shafts 24 and 30 rotate at the same speed. The linear velocities of the drive chains 22 and 28 are equal, and the velocities of the conveyor chains 14 and 15 are equal. The entire conveyor system 13 is preferably driven through the shaft 24 by any suitable driving means.

The conveyor chains 14 and 15 are of a conventional and well known form, alternate links including a laterally extending jaw member 45, as best seen in FIG. 3. These jaws are arranged to receive the edges of printed circuit boards 46 of a specified thickness, which boards may carry electrical components 46*a* having leads extending downward through the board 46.

Figure 2:
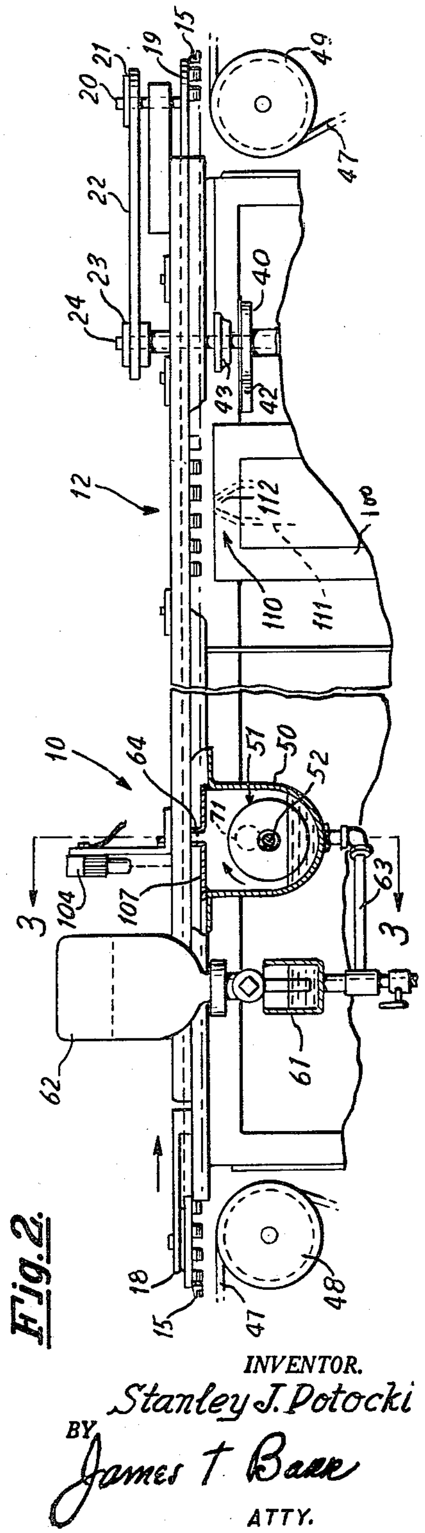
FIGURE 2 is a side elevation, partially broken away, of the same machine.

It may now be seen that with the frame 32 adjustably positioned such that the jaw members 45 of the respective conveyor chains 14 and 15 are spaced the desired distance apart, a printed circuit board of a specific width and of standard thickness may be received between the jaw members of the two conveyor chains and may be conveyed thereby past the operating stations 10 and 12 of the overall machine. Such printed circuit boards may be fed to the conveyor apparatus by hand or by other conveyor apparatus. The boards may, for example, be fed to the above described conveyor apparatus by a conveyor belt 47 passing over a pulley 48, as seen in FIGURE 2. If desired, the same conveyor belt may pass under or around the soldering machine and over a pulley 49 at the right hand end of the machine where it may catch the soldering or tinning printed circuit boards as they are dropped by the diversion of conveyor chains 14 and 15.

At the flux applicator station 10 a housing 50 is provided, within which flux is maintained at a desired level and at a desired temperature. Within the housing 50 is a flux applicator drum 51 that is partially submerged in the liquid flux. The flux level is maintained by hydrostatic pressure from an external level control cup 61 which is fed from a bottle 62 thereabove. A pipe arrangement 63 leads from the bottom of cup 61 to the bottom of housing 50 and serves as the flux inlet.

The drum 51 is cylindrical in form with a shaft 52 extending co-axially from one end thereof. Suitable bearings 54 are secured to the frame or base of the machine for rotatably supporting the shaft 52. The drum 51 consists primarily of an end plate 56 to which the shaft is mounted and an open end 57 through which a pipe may be inserted. A cylindrical screen 53 supported by the closed end of the drum is reinforced by an annular ring 58 at its open end and is adapted to be readily removable for cleaning and for replacement.

As may be seen best in FIGURE 2, all portions of the screen 53 are caused to dip into the flux contained within the flux pot 50 during each revolution of the drum 51. The screen is selected to be of such mesh that the liquid flux employed will form a continuous film over the screen as it emerges from the flux pot. For a conventional viscosity of flux it has been found that a screen of 26 mesh with a wire diameter of .016" is satisfactory for this purpose. It is intended that the film of flux carried by the screen 53 be blown off the screen and against the lower surfaces of the printed circuit boards 46 as they are carried past the flux applicator station 10 by the conveyor means 13. For this purpose it is necessary that air under pressure be brought into the drum 51.

Compressed air may be supplied to the machine from any suitable source, although it will be appreciated that the air should be well screened or filtered. As illustrated in FIG. 3 air under pressure is conducted from a suitable source through a pipe or tube 68 to an electrically operated air valve 70. From the valve 70 a pipe 71 conducts air through the open end of the screen of drum 51 to the interior of the drum. The pipe 71 extends through almost the full length of the drum and is provided with orifices 72 through which the compressed air may be directed upwardly through the screen toward the boards to be fluxed. The orifices 72 are aligned along the top of the pipe 71 as may be seen in FIGURE 3.

Power for rotation of the drum 51 is provided by a motor 101 with a variable speed adjustment which is accomplished through the screw 103. The drum 51 may thus be rotated at any predetermined speed over a relatively wide range. A very active fluxing resin is used, diluted three to one with alcohol, and the amount applied is critical. With good quantity control, uniform flux distribution, and the proper preselected time interval between fluxing and solder application, no intermediate heating is required to get soundly soldered connections by this process. Accurate quantity control is also desirable to avoid excessive risk of clogging movable control elements with dried flux and to conserve flux material.

A slit-like opening 64, above and parallel to the screen axis and perpendicular to the path of conveyor travel, is provided in the top of the housing 50 to act as a nozzle. The nozzle 64 is defined by upturned flanges 65 on housing 50, and it assures that only such flux as is blown substantially straight up from the screen escapes the housing. The boards 46 pass closely over the nozzle 64, and little flux is wasted.

It is desirable that the flow of air through the nozzle 64 be stopped, as by closing valve 70, whenever there is no printed circuit board 46 directly above the drum 51, since flux would otherwise be wasted. The control apparatus comprises a photocell 104 and a light source 105 which is directed downwardly at an angle toward the top 107 of housing 50, which is of reflective metal composition. When no board is present the light reflects into the photocell, and a steady photoelectric current flows in the control circuit. However, when a printed circuit board comes into the path of the light it breaks the photoelectric current flow by diverting the beam or absorbing the beam so that it cannot strike the photocell. This interruption in circuit trips a relay 108 that opens the solenoid valve 70 and causes the air to blow until such time as the photocell again receives light when the board has passed the cell 104. The cell 104 is positioned to detect the boards immediately before they reach the nozzle 64, and a slight time delay is built into the relay 108 to permit spraying at the exact time the board starts to pass over the nozzle. Cell 104 and source 105 are mounted on brackets 106 and 107 extending upwardly from the conveyor supports in any convenient manner. The solenoid and time delay relays are of conventional form, and the electrical control circuitry is not illustrated in the drawings. The air flow is cut off by valve 70 whenever a board 46 is not in position to be sprayed, but the screen rotates continuously to prevent clogging.

The faster the drum rotates the more flux will be picked up in a given time and the more flux will be available to be blown from the screen onto the boards in that time. Therefore, by controlling the speed of rotation, along with the viscosity of the flux and the amount and distribution of air flow, the amount of flux applied to a board can be carefully controlled. This is important because, with too little flux the soldering operation will not be satisfactory, while with too much flux, danger is run that moving elements such as a volume potentiometer or tuning inductance will be clogged by the flux as it hardens. An easy adjustment is therefore desirable and is provided in screw 103.

The printed circuit boards 46 are carried to the soldering station 12 by the conveyors, where the soldering or tinning operation is performed through the use of a conventional and well known device 100 which comprises a fountain 110 of solder playing against the lower surfaces of the printed circuit boards 46. In such a device molten solder is forced upwardly through a nozzle 111 forming a slot 112, most of the solder flowing down the sides 111 and being recirculated. It will be appreciated that the fountain of molten solder constitutes a pool of solder through which objects may move while travelling in a straight line. More particularly, the fountain of solder may bear continuously against the lower surface of the boards 46, the lead ends of the electrical components *46a* being moved through a mass of molten solder. A thin film of solder will, of course, adhere to the flux coated metal portions of the printed circuit boards 46 and to the component leads. Since the soldering apparatus employed at the soldering station 12 of the illustrated machine is preferably of a type well known in the art, and since it does not of itself constitute a feature of the present invention, it is not described herein or illustrated in the drawings in further detail.

An improved method and apparatus have thus been described for fluxing and soldering, which method and apparatus are inherently efficient, reliable, and economical. In addition, the control mechanisms required are simple in nature and easily adjusted to compensate for varying conditions as they are observed in the operation of the machine.

While the preferred embodiment of this invention has been described, it should be understood that many substitutions and modifications may be made without departing from the spirit of this invention or its intended scope. It is not intended that the coverage of claims herein be limited by the ommission of such modifications and substitutions from the specification, but rather only by the language and fair interpretation of the claims themselves.

The invention thus having been described, what is claimed is:

1. Apparatus for fluxing a printed circuit board prior to soldering comprising conveyor means for transporting said printed circuit board at a uniform linear speed, rotating cylindrical screen means disposed adjacent said conveyor means, a housing for said cylindrical screen, said housing containing a liquid flux to a given predetermined level whereby said cylindrical screen is partially submerged therein, the axis of said screen being substantially horizontal, driving means for rotating said screen through said flux, air blower means extending longitudinally within said screen and provided with a plurality of upwardly directed orifices axially spaced apart one from another whereby compressed air will be directed upwardly through said screen to blow said flux from the upper portion of said screen, nozzle means in the top of said housing comprising a slit aligned vertically above said orifices whereby only such flux as is blown upwardly from said screen may escape said housing, said printed circuit passing closely adjacently above said nozzle, solenoid valve means for selectively turning the air flow on and off, and means for detecting the presence of a board opposite said nozzle, said detecting means controlling said solenoid valve in such manner that compressed air is supplied to said tube only when a board is adjacent to said nozzle.

2. Apparatus as set forth in claim 1 wherein said screen is provided with variable speed driving means for controlling the amount of fluxing material that passes said orifices while said board is opposite said nozzle, thereby providing a control of the amount of flux applied to the printed circuit board.

3. Apparatus as set forth in claim 2 wherein said detecting means comprise a horizontal mirror-like reflective surface disposed below said board carrying conveyor, a light source directed at said mirror-like reflective surface at a given angle of incidence, and a photocell similarly directed at said mirror-like reflective surface at an equal angle of reflection thereto and so disposed as to normally receive the light beam from said light source as reflected from said surface, whereby the presence of an object to be soldered above the point of reflection cuts off the light supply to the photocell and renders it non-emmissive, a time delay relay responsive to the change in emissivity to non-emissivity to open said solenoid and initiate air flow when the lead edge of said printed circuit board overlies said nozzle, said relay effecting closure of said solenoid valve upon passage of said board past said point of reflection in response to the reestablishment of emissivity in said photocell, whereby said air flow will be interrupted immediately prior to passage of said board's trailing edge over said nozzle, the direction of movement of said board past said nozzle being substantially perpendicular to the major axis of the nozzle slit.

References Cited in the file of this patent

UNITED STATES PATENTS

| | | |
|---|---|---|
| 581,294 | Lorillard | Apr. 27, 1897 |
| 1,887,416 | Matlack | Nov. 4, 1932 |
| 2,213,108 | Pollard | Aug. 27, 1940 |
| 2,386,813 | O'Brien et al. | Oct. 16, 1945 |
| 2,756,497 | Gale | July 31, 1956 |
| 2,777,419 | Paasche | Jan. 15, 1957 |